(12) United States Patent
Hou et al.

(10) Patent No.: US 6,797,999 B2
(45) Date of Patent: Sep. 28, 2004

(54) FLEXIBLE ROUTING CHANNELS AMONG VIAS

(75) Inventors: Cliff Hou, Taipei (TW); Lee-Chung Lu, Taipei (TW); Chia-Lin Cheng, Tao-Yuan (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/165,336

(22) Filed: Jun. 7, 2002

(65) Prior Publication Data

US 2003/0227084 A1 Dec. 11, 2003

(51) Int. Cl.$^7$ .......................... H01L 27/10; G06F 17/50
(52) U.S. Cl. ........................................ 257/211; 716/14
(58) Field of Search ............. 716/12–15; 257/206–208, 257/210, 211, 758, 773, 776

(56) References Cited

U.S. PATENT DOCUMENTS 5,500,548 A * 3/1996 Smayling .................. 257/371
6,502,231 B1 * 12/2002 Pang et al. .................. 716/17

* cited by examiner

Primary Examiner—Hung Vu
(74) Attorney, Agent, or Firm—Tung & Associates

(57) ABSTRACT

Flexible routing channels among vias is disclosed. A semiconductor device of one embodiment includes a number of metal layers, a number of dielectric layers, a number of via holes, and a number of routing channels. The metal layers are organized along a vertical axis. The dielectric layers are alternatively positioned relative to the metal layers. The via holes are situated within the dielectric layers and electrically connect a lower layer of the metal layers to an upper layer of the metal layers. The routing channels are situated within the metal layers and provide for electrical routing through the device along at least one of two horizontal axes of a horizontal plane perpendicular to the vertical axis.

17 Claims, 3 Drawing Sheets

FLEXIBLE ROUTING CHANNELS AMONG VIAS

FIELD OF THE INVENTION

This invention relates generally to the semiconductor feature known as via holes, or "vias," and more particularly to routing channels among such vias.

BACKGROUND OF THE INVENTION

Via holes, or more simply "vias," are semiconductor device features that are through holes made in a substrate, for a variety of different purposes. Via holes may be used to ground semiconductor devices and passive devices. Via holes may be made through dielectric layers, for subsequent metal deposition to form a plug and create an interconnect between two metal lines. Multi-level interconnect schemes may employ such via holes. Processes used to perform such interconnection using via holes include the damascene process and the dual-damascene process, among other processes.

Within an integrated circuit (IC) layout that has a number of metal layers, vias are particularly employed to connect signals from lower metal layers to upper metal layers. However, the presence of the vias blocks the routing of wires horizontally. The typical solution to this difficulty is to add a limited number of routing channels among the vias. Wires can then be placed or fabricated through or within the routing channels to enable horizontal routing along one or both axes of the horizontal plane. Thus, using routing channels enables horizontal routing through the IC layout.

A difficulty with this current deployment of routing channels, however, is that they do not provide flexible routing within the IC layout. In particular, the placement orientation of the layout relative to the horizontal plane may have to be fixed, so that the wires running through or within the routing channels remain in the same direction relative to the routing channels. This constrains semiconductor designs and fabricators in designing and fabricating semiconductor IC's. In turn, this adds cost to the semiconductor device design and fabrication processes, as well as introducing delay into these oftentimes-critical processes.

FIG. 1 shows an exploded three-dimensional perspective view of a sample IC layout 100 that exhibits the routing inflexibility of placing routing channels among vias in the prior art. Three layers of the IC layout 100 are shown: top and bottom inter-metal dielectric (IMD) layers 102 and 106, sandwiching a middle metal layer 104. Via holes are located within the IMD layers 102 and 106, to connect the middle metal layer 104 with other metal layers above and below the middle metal layer 104, respectively. However, they are not shown in FIG. 1 for illustrative clarity.

A horizontal plane is defined by the x-axis 112 and the y-axis 114. Thus, whereas the via holes not shown in FIG. 1 connect the metal layer 104 to other metal layers through the IMD layers 102 and 106 along the z-axis 116, the routing channels enable routing wire, such as copper or aluminum wire, to route through the IC layout 100 along the horizontal plane. In particular, there are two routing channels through the metal layer 104 represented by the arrows 108, along the x-axis 112. However, there are no corresponding routing channels through the metal layer 104 along the y-axis 114, as aptly indicated in FIG. 1 by the blocked arrow 110.

This means that once the orientation of the semiconductor device represented by the IC layout 100 of FIG. 1 is determined relative to the routing wires through the IC layout 100, the orientation cannot be subsequently changed. For example, the positioning of the IC layout 100 cannot be rotated ninety degrees. This is because the routing wires that pass freely through the routing channels represented by the arrows 108 along the x-axis 112 cannot pass freely along the y-axis 114. Thus, the semiconductor designers and fabricators are restricted to the initially determined orientation.

Therefore, there is a need for improved flexibility in positioning semiconductor IC layouts relative to routing wires passing through routing channels among vias. Such improved flexibility should desirably ensure that the orientation of IC layouts relative to their routing wires can be rotated as necessary by semiconductor designers and fabricators. That is, the orientation of IC layouts relative to their routing wires can be reconfigured even after initial determination. For these and other reasons, there is a need for the present invention.

SUMMARY OF THE INVENTION

The invention relates to flexible routing channels among vias. A semiconductor device of an embodiment of the invention includes a number of metal layers, a number of dielectric layers, a number of via holes, and a number of routing channels. The metal layers are organized along a vertical axis. The dielectric layers are alternatively positioned relative to the metal layers. The via holes are situated within the dielectric layers and electrically connect a lower layer of the metal layers to an upper layer of the metal layers. The routing channels are situated within the metal layers and provide for electrical routing through the device along at least one of two horizontal axes of a horizontal plane perpendicular to the vertical axis.

Embodiments of the invention provide for advantages over the prior art. The routing channels enable a semiconductor layout of the semiconductor device to be rotated during the design and/or fabrication thereof without affect the electrical routing of wires or other metal elements through the routing channels. Thus, the orientation of the layout can be rotated relative to the routing wires even after initial determination thereof. That is, the layout can be rotated as necessary be designers and/or fabricators of the layout and the semiconductor device. Other advantages, embodiments, and aspects of the invention will become apparent by reading the detailed description that follows, and by referencing the attached drawings.

BRIEF DESCRIPTION OF THE DRAWINGS

The drawings referenced herein form a part of the specification. Features shown in the drawing are meant as illustrative of only some embodiments of the invention, and not of all embodiments of the invention, unless otherwise explicitly indicated, and implications to the contrary are otherwise not to be made.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 1:
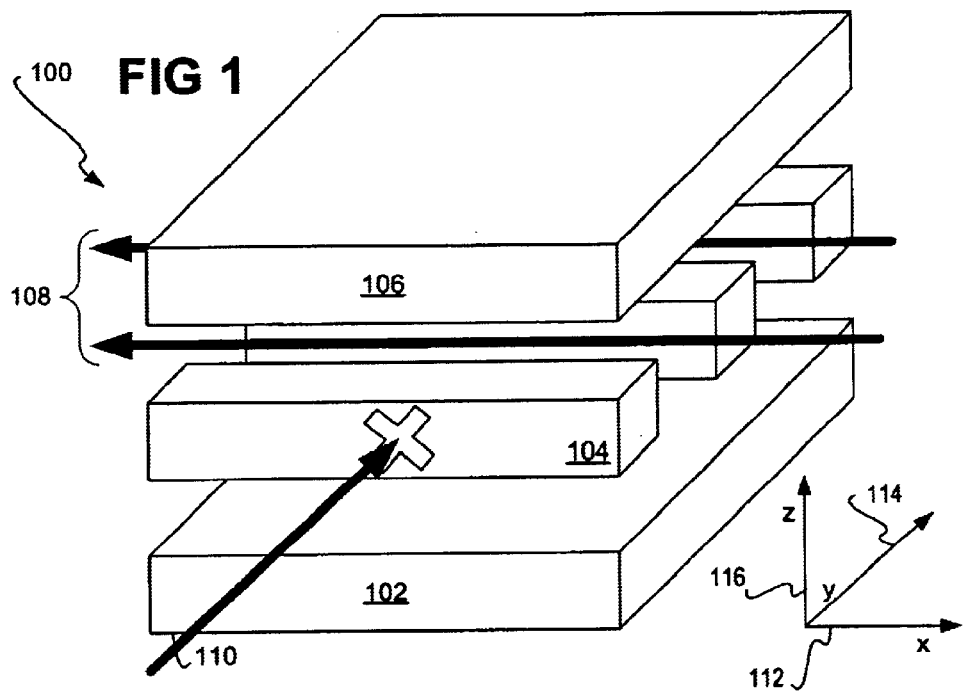
FIG. 1 is a diagram of an exploded three-dimensional perspective view of an example integrated circuit (IC) layout that suffers from inflexible placement orientation relative to routing wires running within routing channels among vias, after initial determination of the orientation has been made, according to the prior art.
Figure 2:
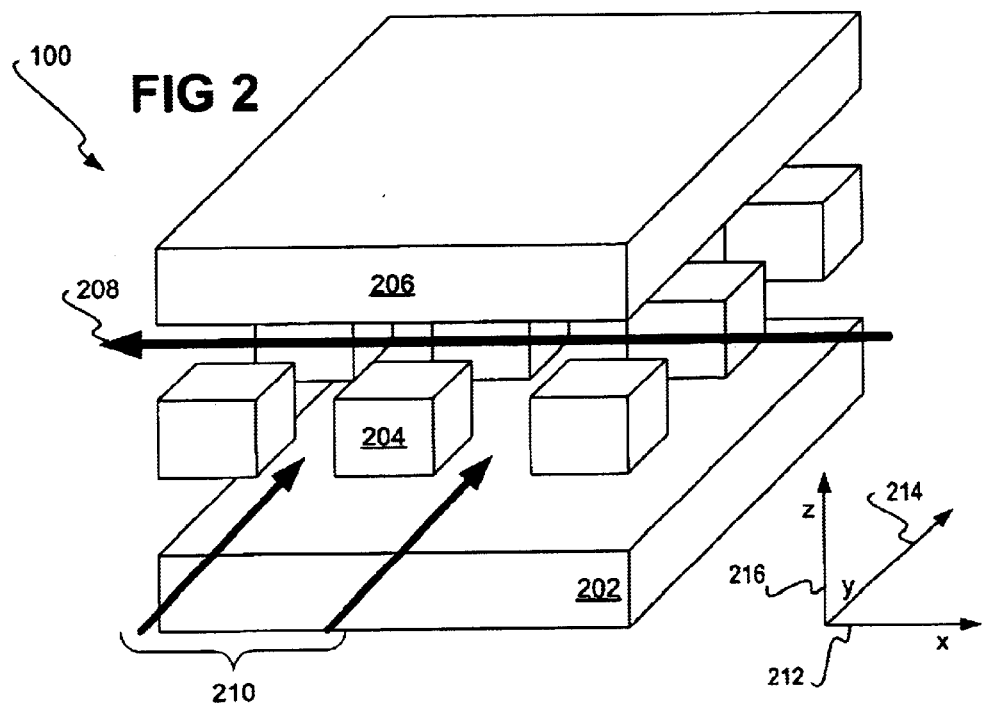
FIG. 2 is a diagram of an exploded three-dimensional perspective view of an example IC layout according to an embodiment of the invention that provides more flexible placement orientation thereof relative to routing wires running within routing channels among vias.

FIG. 2 shows an exploded three-dimensional perspective view of a sample integrated circuit (IC) layout 200 that exhibits routing flexibility of the placement of routing channels among vias, according to an embodiment of the invention. A semiconductor device can be fabricated at least in part by using the IC layout 200. Three layers of the IC layout 200 are shown: top and bottom inter-metal dielectric (IMD) layers 202 and 206, sandwiching a middle metal layer 204. It is said that the metal layer 204, among other metal layers, is alternatively positioned or situated relative to the IMD layers 202 and 206, among other IMD layers. Via holes are located within the IMD layers 202 and 206, to connect the middle metal layer 204 with other metal layers above and below the middle metal layer 204, respectively. However, they are not shown in FIG. 2 for illustrative clarity.

A horizontal plane is defined by the x-axis 212 and the y-axis 214. Thus, whereas the via holes not shown in FIG. 2 connect the metal layer 204 to other metal layers through the IMD layers 202 and 206 along the z-axis 216, the routing channels enable routing wire or other routing elements, such as copper or aluminum wire, to route through the IC layout 200 along the horizontal plane. Along the x-axis 212, there is particularly identified one routing channel through the metal layer 204 represented by the arrow 208. Along the y-axis 214, there are particularly identified two routing channels through the metal layer 204 identified by the arrows 210.

This means that once the orientation of the semiconductor device represented by the IC layout 200 of FIG. 2 is determined relative to the routing wires through the IC layout 200, the orientation is easily subsequently changed. For example, the positioning of the IC layout 200 can be rotated ninety degrees. This is because the routing wires that pass freely through the routing channels represented by the arrow 208 along the x-axis 212 can also pass freely along the y-axis 214 through the routing channels represented by the arrows 210. Thus, the semiconductor designers and fabricators are not restricted to the initially determined orientation.

The via holes not shown in the IC layout 200 of FIG. 2 particularly electrically connect a lower metal layer, such as a bottom or lowest metal layer, to an upper metal layer, such as a top or highest metal layer. The dielectric layers including the IMD layers 202 and 206 are alternatively positioned relative to the metal layers, including the metal layer 204. The routing channels, such as those represented by the arrows 208 and 210, are situated within the metal layers to provide for electrical routing along a horizontal plane perpendicular to the vertical axis 116. At least some of the vias, or via holes, may remain unused, such that they electrically connect to electrically isolated parts of the metal layers. At least some of the routing channels may also remain unused, such that they are electrically isolated, such as by being filled with or being surrounded by silicon dioxide, or oxide.

Figure 3:
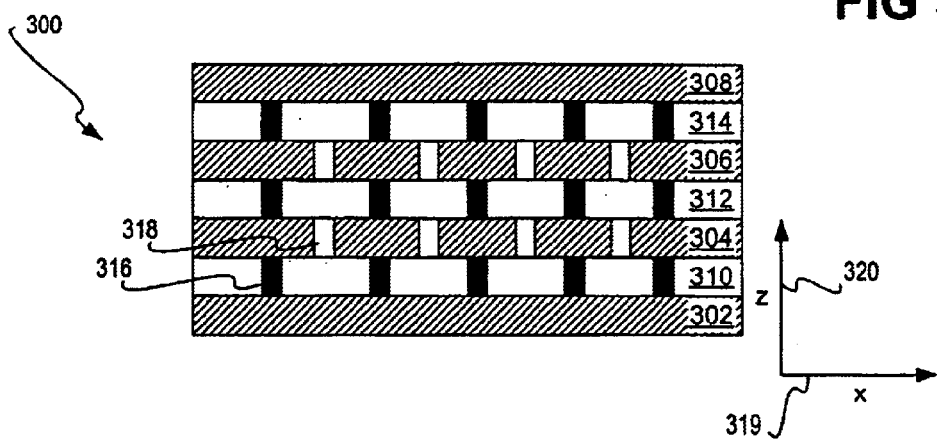
FIG. 3 is a diagram of a cross-sectional view along one axis of a horizontal plane of an example IC layout according to an embodiment of the invention. A semiconductor device can be fabricated according to the IC layout of FIG. 3.

FIG. 3 shows a cross-sectional side profile of an IC layout 300, which may be the IC layout 200, according to an embodiment of the invention. The side profile shown in FIG. 3 looks along the y-axis into the page, such that the x-axis 319 and the z-axis 320 are shown as indicated in FIG. 3. The layout 300 includes a number of metal layers 302, 304, 306, and 308. The layout 300 also includes a number of dielectric layers 310, 312, and 314. There are routing channels along the y-axis within the metal layers 304 and 306, such as the routing channel 318. There are vias within the dielectric layers 310, 312, and 314, such as the via 316. The routing channels enable metal elements, such as metal wires, to be routed through the IC layout 300 along the y-axis into the page. The vias enable the bottom metal layer 302 to electrically connect to the top metal layer 308 along the z-axis 320. As before, at least some of the routing channels and at least some of the vias may be unused.

Figure 4:
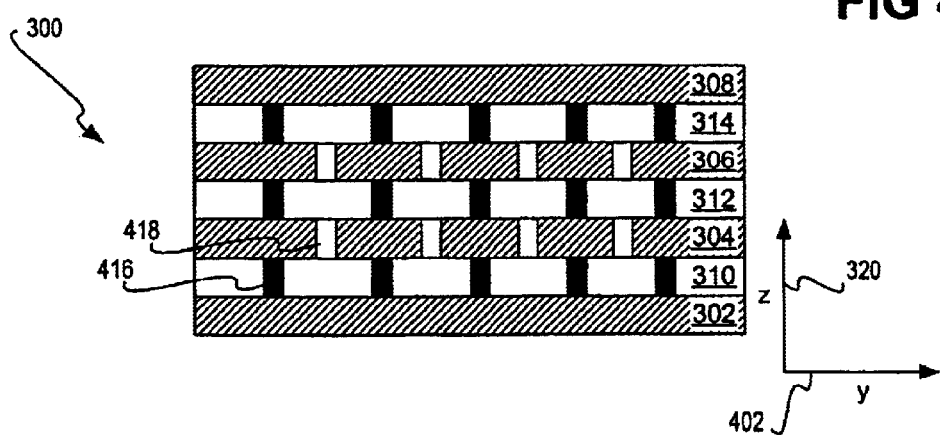
FIG. 4 is a diagram of a cross-sectional view along the other axis of the horizontal plane of the example IC layout of FIG. 3, according to an embodiment of the invention, and similarly provides flexible placement orientation thereof relative to routing wires running within routing channels among vias.

FIG. 4 shows a cross-sectional side profile of the IC layout 300 that looks along the x-axis into the page, such that the y-axis 402 and the z-axis 320 are shown as indicated in FIG. 4. There are routing channels along the x-axis within the metal layers 304 and 306, such as the routing channel 418. There are vias within the dielectric layers 310, 312, and 314, such as the via 416. The routing channels enable metal elements, such as metal wires, to be routed through the IC layout 300 along the x-axis into the page. The vias, as before, enable the bottom metal layer 302 to electrically connect to the top metal layer 308 along the z-axis 320. Also as before, at least some of the routing channels and the vias may be unused. Because there are routing channels both along the y-axis, as shown in FIG. 3, and along the x-axis, as shown in FIG. 4, the layout 300 may be rotated without affecting this electrical routing through the metal layers 304 and 306. It is noted that preferably each routing channel and each via is surrounded or circumscribed by an insulator, such as silicon oxide, to prevent electrical shorting with metal layers, as can be appreciated by those of ordinary skill within the art.

Figure 5:
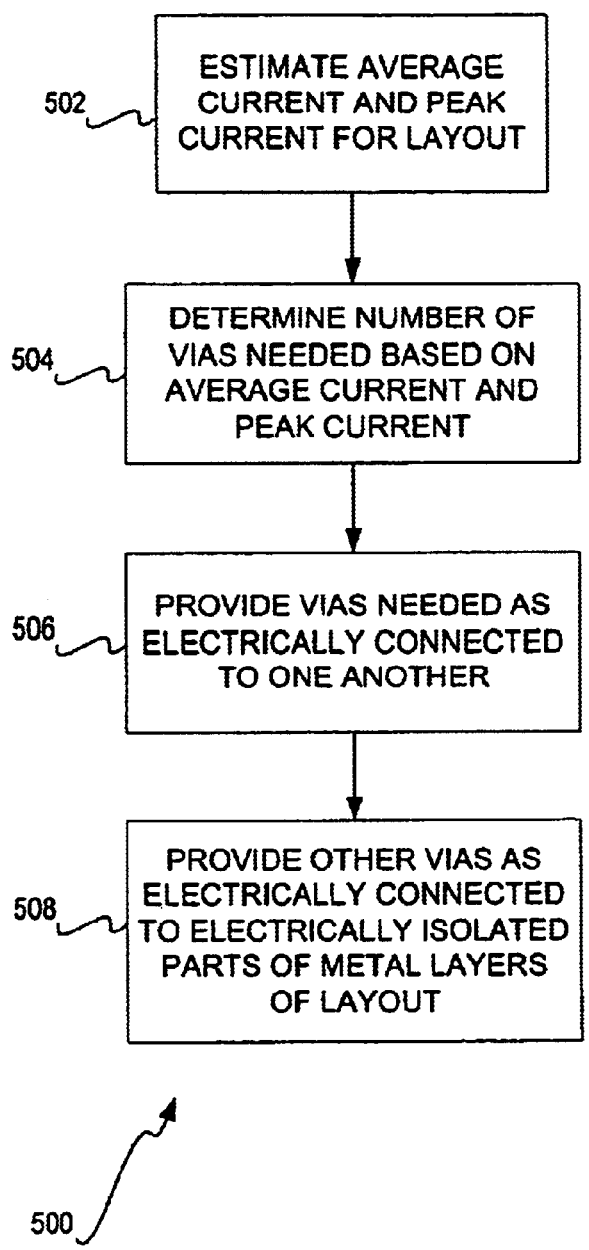
FIG. 5 is a flowchart of a method according to an embodiment of the invention.

FIG. 5 shows a method 500 according to an embodiment of the invention. The method 500 is used in conjunction with a semiconductor layout of a semiconductor device, as has been described, such as the layout 200 of FIG. 2 and/or the layout 300 of FIGS. 3 and 4. Other layouts may also be used, however. The method 500 is to determine the number of vias needed to connect upper and lower metal layers of the semiconductor layout. First, the average and peak currents for the semiconductor layout are determined (502). Next, the number of vias needed to accommodate the average and peak currents, to electrically connect the upper and lower metal layers as necessary, are determined, based on the average and peak currents that have been determined (504). These vias are then provided for in the layout as electrically connected to one another, so that the upper and lower metal layers are likewise electrically connected (506). Finally, preferably but optionally the other vias are electrically connected to electrically isolated parts of the metal layers of the layout, so that they are effectively not used (508).

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

What is claimed is:

1. A semiconductor device comprising:

a plurality of metal layers organized along a vertical axis;

a plurality of dielectric layers alternatively positioned relative to the plurality of metal layers;

a plurality of via holes situated within the plurality of dielectric layers to electrically connect a lower layer of the plurality of metal layers to an upper layer of the plurality of metal layers; and, a plurality of routing channels situated within the plurality of metal layers to provide for electrical routing through the semiconductor device along two different horizontal axes of a horizontal plane perpendicular to the vertical axis, the routing channels receptive to routing wires to enable the routing wires to pass freely through the semiconductor device, wherein each routing channel passes in a straight line from one side of the semiconductor device to another side of the semiconductor device, and each routing channel of each metal layer along one of the horizontal axes intersects perpendicularly every routing channel of that metal layer along the other of the horizontal axes.

2. The semiconductor device of claim 1, wherein the plurality of routing channels allow for rotation of a semiconductor layout of the semiconductor device without affecting the electrical routing.

3. The semiconductor device of claim 1, wherein the plurality of routing channels are receptive to one or more metal elements for the electrical routing.

4. The semiconductor device of claim 3, wherein the one or more metal elements comprise one or more metal wires.

5. The semiconductor device of claim 3, wherein the one or more metal elements comprise at least one of: a copper element, and an aluminum element.

6. The semiconductor device of claim 1, wherein at least one of the plurality of via holes remain unused.

7. The semiconductor device of claim 6, wherein the at least one of the plurality of via holes each electrically connect to an electrically isolated part of one of the plurality of metal layers.

8. The semiconductor device of claim 1, wherein at least one of the plurality of routing channels remain unused.

9. The semiconductor device of claim 8, wherein the at least one of the plurality of routing channels are electrically isolated.

10. The semiconductor device of claim 1, wherein the upper layer comprises one of a top layer and a layer other than the top layer and the lower layer comprises one of a bottom layer and a layer other than the bottom layer.

11. A layout for a semiconductor integrated circuit (IC) comprising:

a layout portion specifying a plurality of metal layers organized along a vertical axis;

a layout portion specifying a plurality of dielectric layers alternatively positioned relative to the plurality of metal layers;

a layout portion specifying a plurality of via holes situated within the plurality of dielectric layers to electrically connect a lower layer of the plurality of metal layers to an upper layer of the plurality of metal layers; and, a layout portion specifying a plurality of routing channels situated within the plurality of metal layers to provide for electrical routing through the semiconductor IC along two different axes of a horizontal plane perpendicular to the vertical axis, the routing channels receptive to routing wires to enable the routing wires to pass freely through the semiconductor IC, wherein each routing channel passes in a straight line from one side of the semiconductor IC to another side of the semiconductor IC, and each routing channel of each metal layer along one of the horizontal axes intersects perpendicularly every routing channel of that metal layer along the other of the horizontal axes.

12. The layout of claim 11, wherein the plurality of routing channels allow for rotation of the layout without affecting the electrical routing.

13. The layout of claim 11, wherein the plurality of routing channels are receptive to one or more metal elements for the electrical routing.

14. The layout of claim 13, wherein the one or more metal elements comprise one or more metal wires.

15. The layout of claim 13, wherein the one or more metal elements comprise at least one of: a copper element, and an aluminum element.

16. The layout of claim 11, wherein at least one of the plurality of routing channels remain unused.

17. The layout of claim 16, wherein the at least one of the plurality of routing channels are electrically isolated.

* * * * *